United States Patent
Gupta

(10) Patent No.: US 8,970,252 B2
(45) Date of Patent: Mar. 3, 2015

(54) FIELD PROGRAMMABLE ANALOG ARRAY

(75) Inventor: Dev V. Gupta, Concord, MA (US)

(73) Assignee: Newlans, Inc., Acton, MA (US)

(*) Notice: Subject to any disclaimer, the term of this patent is extended or adjusted under 35 U.S.C. 154(b) by 128 days.

(21) Appl. No.: 13/883,597

(22) PCT Filed: Nov. 1, 2011

(86) PCT No.: PCT/US2011/058786
§ 371 (c)(1),
(2), (4) Date: Jul. 23, 2013

(87) PCT Pub. No.: WO2012/064551
PCT Pub. Date: May 18, 2012

(65) Prior Publication Data
US 2013/0293264 A1 Nov. 7, 2013

Related U.S. Application Data

(60) Provisional application No. 61/411,166, filed on Nov. 8, 2010.

(51) Int. Cl.
*H03K 19/177* (2006.01)
(52) U.S. Cl.
CPC .................................. *H03K 19/177* (2013.01)
USPC ............................................. 326/41; 326/39
(58) Field of Classification Search
USPC ...................................................... 326/37–41
See application file for complete search history.

(56) References Cited

U.S. PATENT DOCUMENTS

| | | | |
|---|---|---|---|
| 3,434,060 A | 3/1969 | Painter et al. |
| 3,550,116 A | 12/1970 | Zeniti et al. |
| 3,978,416 A | 8/1976 | Sutphin, Jr. |
| 4,086,539 A | 4/1978 | Gustafson et al. |
| 4,179,665 A | 12/1979 | Gregorian |
| 4,507,791 A | 3/1985 | Gundry |
| 5,144,258 A | 9/1992 | Nakanishi et al. |
| 5,157,346 A | 10/1992 | Powell et al. |
| 5,325,204 A | 6/1994 | Scarpa |
| 5,574,678 A | 11/1996 | Gorecki |
| 5,959,871 A | 9/1999 | Pierzchala et al. |

(Continued)

FOREIGN PATENT DOCUMENTS

| | | |
|---|---|---|
| CN | 1172558 A | 2/1998 |
| CN | 1509534 (A) | 6/2004 |

(Continued)

OTHER PUBLICATIONS

Notification Concerning Transmittal of Copy of International Preliminary Report on Patentability, International Application No. PCT/US2012/062965, "Wideband Signal Processing," date mailed, May 15, 2014.

(Continued)

Primary Examiner — Don Le
(74) Attorney, Agent, or Firm — Hamilton, Brook, Smith & Reynolds, P.C.

(57) ABSTRACT

In an embodiment, a field programmable analog array (FPAA) comprises state variable filter engines arranged in parallel, each state variable filter engine comprising at least one variable attenuator and at least one variable integrator configured to operate on a wideband analog signal; and a summer configured to add outputs from the state variable filter engines.

18 Claims, 12 Drawing Sheets

(56) References Cited

U.S. PATENT DOCUMENTS

| | | | |
|---|---|---|---|
| 6,118,794 | A | 9/2000 | Cornfield et al. |
| 6,359,507 | B1 | 3/2002 | Myer |
| 6,384,761 | B1 * | 5/2002 | Melanson .................. 341/143 |
| 6,424,209 | B1 | 7/2002 | Gorecki et al. |
| 6,593,812 | B2 | 7/2003 | Sundström |
| 6,677,876 | B1 | 1/2004 | Hoggarth et al. |
| 6,765,377 | B1 | 7/2004 | Lu |
| 6,774,719 | B1 | 8/2004 | Wessel et al. |
| 6,919,763 | B2 | 7/2005 | Boscolo et al. |
| 6,937,175 | B1 | 8/2005 | Cruz-Albrecht et al. |
| 7,158,591 | B2 | 1/2007 | Harris |
| 7,733,950 | B2 | 6/2010 | Ko |
| 8,126,949 | B1 * | 2/2012 | Scheuermann et al. ...... 708/319 |
| 8,483,626 | B2 | 7/2013 | Gupta |
| 8,779,832 | B2 | 7/2014 | Gupta |
| 8,866,531 | B2 | 10/2014 | Gupta et al. |
| 2001/0041957 | A1 | 11/2001 | McCann et al. |
| 2002/0114270 | A1 | 8/2002 | Pierzga et al. |
| 2002/0196876 | A1 | 12/2002 | Takada |
| 2003/0076907 | A1 | 4/2003 | Harris |
| 2003/0155922 | A1 | 8/2003 | Royle et al. |
| 2004/0021594 | A1 | 2/2004 | Melanson |
| 2004/0078403 | A1 * | 4/2004 | Scheuermann et al. ...... 708/322 |
| 2005/0038847 | A1 | 2/2005 | Cheng et al. |
| 2005/0052226 | A1 | 3/2005 | Doerrer |
| 2005/0077960 | A1 | 4/2005 | Kim et al. |
| 2005/0130609 | A1 | 6/2005 | Nagode et al. |
| 2005/0266805 | A1 | 12/2005 | Jensen |
| 2005/0275577 | A1 | 12/2005 | Bjornsen |
| 2006/0092057 | A1 | 5/2006 | Slavin |
| 2006/0158247 | A1 | 7/2006 | Lee |
| 2006/0186995 | A1 | 8/2006 | Wu et al. |
| 2006/0261846 | A1 | 11/2006 | Twigg |
| 2006/0284687 | A1 | 12/2006 | Abel |
| 2007/0146071 | A1 | 6/2007 | Wu |
| 2007/0286264 | A1 | 12/2007 | Kontola et al. |
| 2009/0184769 | A1 | 7/2009 | Lee et al. |
| 2011/0051782 | A1 | 3/2011 | Gupta et al. |
| 2012/0249093 | A1 | 10/2012 | Grbo et al. |
| 2013/0106487 | A1 | 5/2013 | Gupta |
| 2013/0293308 | A1 | 11/2013 | Gupta |
| 2014/0306777 | A1 | 10/2014 | Gupta |

FOREIGN PATENT DOCUMENTS

| | | |
|---|---|---|
| CN | 101053160 (A) | 10/2007 |
| EP | 0579875 A1 | 1/1994 |
| GB | 2296165 (B) | 12/1999 |
| GB | 2 439 116 A | 12/2007 |
| JP | 2007-058596 A | 3/1995 |
| JP | 2007-240664 A | 9/1995 |
| JP | 2008-122408 A | 5/2008 |
| JP | 2011-526428 | 10/2011 |
| WO | WO 02/095990 A1 | 11/2002 |
| WO | WO 2006-131565 A1 | 12/2006 |
| WO | WO 2009/114123 A2 | 9/2009 |
| WO | WO 2011/152896 A1 | 12/2011 |
| WO | WO 2012/061385 A1 | 5/2012 |
| WO | WO 2012/064551 A2 | 5/2012 |

OTHER PUBLICATIONS

Notice of Allowance in U.S. Appl. No. 12/921,987, dated May 7, 2014.
Notice of Allowance in U.S. Appl. No. 13/576,635, dated Jul. 11, 2014.
Supplementary European Search Report, Application No. EP 11790125, "Broadband Analog Radio-Frequency Components," date May 12, 2014.
International Search Report and Written Opinion of the International Searching Authority mailed Jun. 29, 2012 from International Application No. PCT/US2011/058786 filed Nov. 1, 2011.
Notification of Transmittal of the International Search Report and the Written Opinion of the International Searching Authority, or the Declaration for PCT/US2013/057996, "Bi-Quad Calibration", mailed Dec. 26, 2013.
Franco, Sergio, "State-Variable and Biquad Filters" (Jan. 1, 1988), in *Design With Operational Amplifiers and Analog Integrated Circuits*, (McGraw-Hill Book Company), pp. 136-145, XP009153311.
Notification Concerning Transmittal of Copy of International Preliminary Report on Patentability for Int'l Application No. PCT/US2009/001512, "Method, System, and Apparatus for Wideband Signal Processing," Date Mailed: Sep. 23, 2010.
S.P. et al. 'A Transmitter IC for Tetra Systems Based on Cartesian Feedback Loop Linearization Technique', in: IEEE Journal of Solid-State Circuits, vol. 40, No. 3, Mar. 2005, pp. 707-718.
C.J.S. et al. 'A new adaptive double envelope feedback (ADEF) linearizer for mobile radio power amplifiers', in: IEEE MIT-S International Microwave Symposium Digest, 1994, pp. 573-576.
Notification Concerning Transmittal of a Copy of International Preliminary Report on Patentability PCT/US2011/058785, "Method and Apparatus for Power Amplifier Linearization," Date of Mailing, May 16, 2013.
International Search Report and Written Opinion of the International Searching Authority mailed Feb. 9, 2012 from PCT/US2011/058785, "Method and Apparatus for Power Amplifier Linearization," filed Nov. 1, 2011.
Notification Concerning Transmittal of a Copy of International Preliminary Report on Patentability PCT/US2011/058786, "Field-Programmable Analog Array" Date of Mailing, May 23, 2013.
Notification of Transmittal of the International Search Report and the Written Opinion of the International Searching Authority, or the Declaration for PCT/US2012/062965, "Wideband Signal Processing," mailed Feb. 26, 2013.
Notification of Transmittal of the International Search Report and the Written Opinion of the International Searching Authority, or the Declaration for PCT/US2009/001512, "Method, System, and Apparatus for Wideband Signal Processing," mailed Oct. 20, 2009.
Supplementary European Search Report, Application No. EP 09721007, "Method, System, and Apparatus for Wideband Signal Processing," dated Nov. 17, 2011.
Notification of Transmittal of the International Search Report and the Written Opinion of the International Searching Authority, of the Declaration, PCT/US2011/024542, "Broadband Analog Radio-Frequency Components," Date Mailed: Oct. 31, 2011.
International Preliminary Report on Patentability, International Application No. PCT/US2011/024542, "Broadband Analog Radio-Frequency Components," Date Mailed: Aug. 23, 2012.

\* cited by examiner

FIELD PROGRAMMABLE ANALOG ARRAY

RELATED APPLICATIONS

This application is the U.S. National Stage of International Application No. PCT/US2011/058786, filed Nov. 1, 2011, which designates the U.S., published in English, and claims the benefit of U.S. Provisional Application No. 61/411,166, filed on Nov. 8, 2010. The entire teachings of the above applications are incorporated herein by reference.

BACKGROUND

Field Programmable Gate Arrays (FPGAs) provide digital engineers with the ability to rapidly implement digital circuits for a wide range of single-input single-output (SISO) and multiple-input multiple-output (MIMO) applications. At present, analog engineers do not have a comparable tool that operates over a broad frequency range. Attempts have been made to develop an analog equivalent to the FPGA, but the current state of technology is limited to narrowband field programmable analog array (FPAA) applications.

FPGAs provide programmability to customers to test and revise their designs quickly and with minimum development cost. This minimizes the time to market. In addition, the FPGA can be upgraded in the field which allows the customer to modify the design after the electronic system has been shipped. Recent market trends suggest that customers are increasingly using FPGA not only for prototyping, but also in production designs. The Department of Defense Joint Tactical Radio System (JTRS) is a good example. However, these advantages come at a price. Programmability requires a larger die size which translates to higher per unit cost when compared to application specific integrated circuits (ASICs). FPGAs also have higher power consumption for wideband or high data rate signals because of the high sampling rate required to comply with the Nyquist criteria and contributes to propagation delay.

Although the equivalency between digital and analog signal processing was long established, the technology development and market acceptance of the former outpaced the latter for at least four reasons. One, the digital signal is less susceptible to interference than an analog one. Two, a digital system is software based and, hence, the implemented functionality can be changed easily. Three, there is an increasing ability to apply complex mathematical techniques to digital signals and, finally, the availability of deep submicron CMOS technology.

Research on FPAAs began to appear in the academic literature in the early 1990s. Continued research and development over the past 15 to 20 years has led to greater consensus regarding FPAA architectural principles. Standard terms such as CABs (Configurable Analog Blocks) have sprung up, built from common constructions which use op amps and programmable passive components such as switched capacitor and resistor arrays. These CAB sub-components can act as integrators, summers, and attenuators which provide networks of CABs with higher-level functionality. The resultant FPAA has applications in filtering, amplification, signal conditioning, and waveform synthesis, among others.

FPAA designs have been advancing in the last several years. An FPAA developed at Georgia Tech is an integrated device containing CABs and interconnects between these blocks. It is intended to impact analog signal processing in two ways. First, it performs the function of all rapid prototyping devices in reducing development time. Second, it is a platform for implementing advanced signal processing functions, usually reserved for a digital system, in analog circuits.

Recently there have been several breakthroughs in the FPAA research. First, there is an increasing trend towards the use of high frequency, small geometry CMOS op amps as the major functional block of a CAB. Madian introduced an FPAA using CMOS Current Feedback Op Amps (CFOA) in a switch matrix specially built for high frequency, programmable filtering applications. A key drawback is low demonstrated bandwidth (order of 1 MHz). Becker created an FPAA in 130 nm CMOS using Operational Transconductance Amplifiers arranged in a hexagonal topology to achieve a routing network which avoids band-limiting switches. Here, the emphasis was on high bandwidth (order of 100 MHz) and low power consumption (<70 mW). The hexagonal structure allows for odd-order feedback in addition to even-order feedback. Unfortunately, this design suffers from poor scalability (single filter at a time with a 7th order maximum). It can be surmised that these new types of FPAAs will soon be used to demonstrate a wide variety of MIMO applications, particularly in advanced radar and wireless communications systems. However, wider bandwidth and sufficiently low power consumption per channel are first required.

SUMMARY

Embodiments of the present invention include FPAAs implemented using state variable filter engines arranged in parallel or in series to operate on a wideband analog signal. Each state variable filter engine includes at least one variable attenuator or tunable loss pad and at least one variable integrator configured to operate the wideband analog signal or a signal derived from the wideband analog signal. In some example FPAAs, the state variable filter engines include second-order state variable filters.

Alternative embodiments include an FPAA implemented with an array of N×M attenuator matrices and a set of K variable integrators, where K, M, and N, are positive integers. Each attenuator matrix includes a set of variable attenuators, where the number of variable attenuators depends on the rank of the attenuator matrix: the matrix in the 11 position includes K×K attenuators; the matrix in the 1M position includes N×K attenuators; the matrix in the N1 position includes K×M attenuators; the matrix in the NM position includes N×M attenuators; and so on. The attenuators in attenuator matrices are each configured to operate on at least one wideband analog signal. The integrators, which may be tuned locally, are operably coupled to each of the attenuator matrices and configured to integrate signals from at least one of the attenuator matrices. Examples of this alternative FPAA may be a SISO FPAA by setting M=1 and N=1; setting M>1 and N>1 makes the FPAA a MIMO FPAA.

Example FPAAs can be implemented in deep submicron complementary metal oxide semiconductor (CMOS) technology, e.g., in 130 nm CMOS, 65 nm CMOS, 45 nm CMOS, and 22 nm CMOS technology. Specifically, the variable integrators and variable attenuators may be fabricated using deep submicron CMOS technology. Example FPAAs may also include digital controllers or interfaces configured to adjust integration and attenuation values in the digital domain. Example FPAAs may also be combined with other digital signal processors, such as FPGAs, to provide optimum processing performance.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

Figures 1A, 1B:
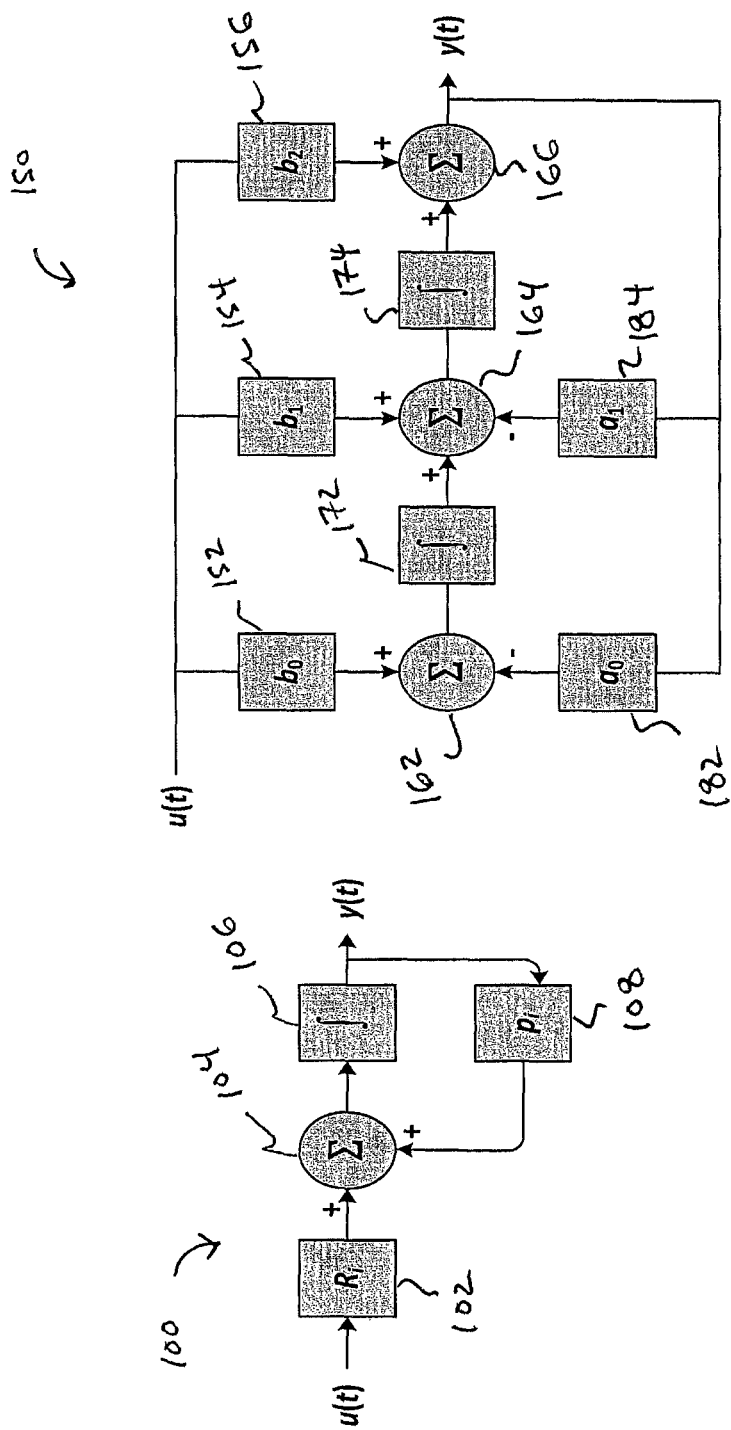
FIGS. 1A and 1B are block diagrams of first and second order canonical forms, respectively, of a state variable system.

FIGS. 1A and 1B show a first order state variable structure 100 and a second order state variable structure 150, respectively, suitable for building a wideband SISO FPAA. The first-order state variable filter 100 operates on a wideband analog input u(t) to produce a filtered analog output y(t). A residue block 102 determines the input's residue $R_i$, which is forwarded to a summer 104 that combines the residue with a pole $p_i$ of the filtered output. The summer 104 forwards the sum of the residue and the pole to an integrator 106. A pole block 108 produces the pole $p_i$ of the integrator output, which is fed back to the summer 104. Changing the parameters of the residue block 102 and the pole block 108 (i.e., changing the filter tap weights) changes the filter transfer characteristics, including the filter center frequency and pass bandwidth.

The second-order state variable filter 150 shown in FIG. 1B also operates on a wideband analog input u(t) to produce a filtered analog output y(t). Here, however, fractional gain blocks (also known as attenuators or tap weights) 152, 154, and 156 scale the wideband input by amounts $b_0$, $b_1$, and $b_2$, respectively, and forward the resulting scaled outputs to summers 162, 164, and 166, respectively. The first summer 162 combines (subtracts) a scaled output from fractional gain block 152 with (from) the output of fractional gain block 182 to provide a combined signal, which is integrated with a first integrator 172. The output of the first integrator 172 is combined with outputs of fractional gain blocks 154 and 184, then integrated with a second integrator 174. The output of the second integrator 174 is combined with outputs of fractional gain block 156 to produce the filtered output y(t). The filtered output is forwarded to fractional gain blocks 182 and 184, which scale the filtered output by $a_0$ and $a_1$, respectively.

Figure 1C:
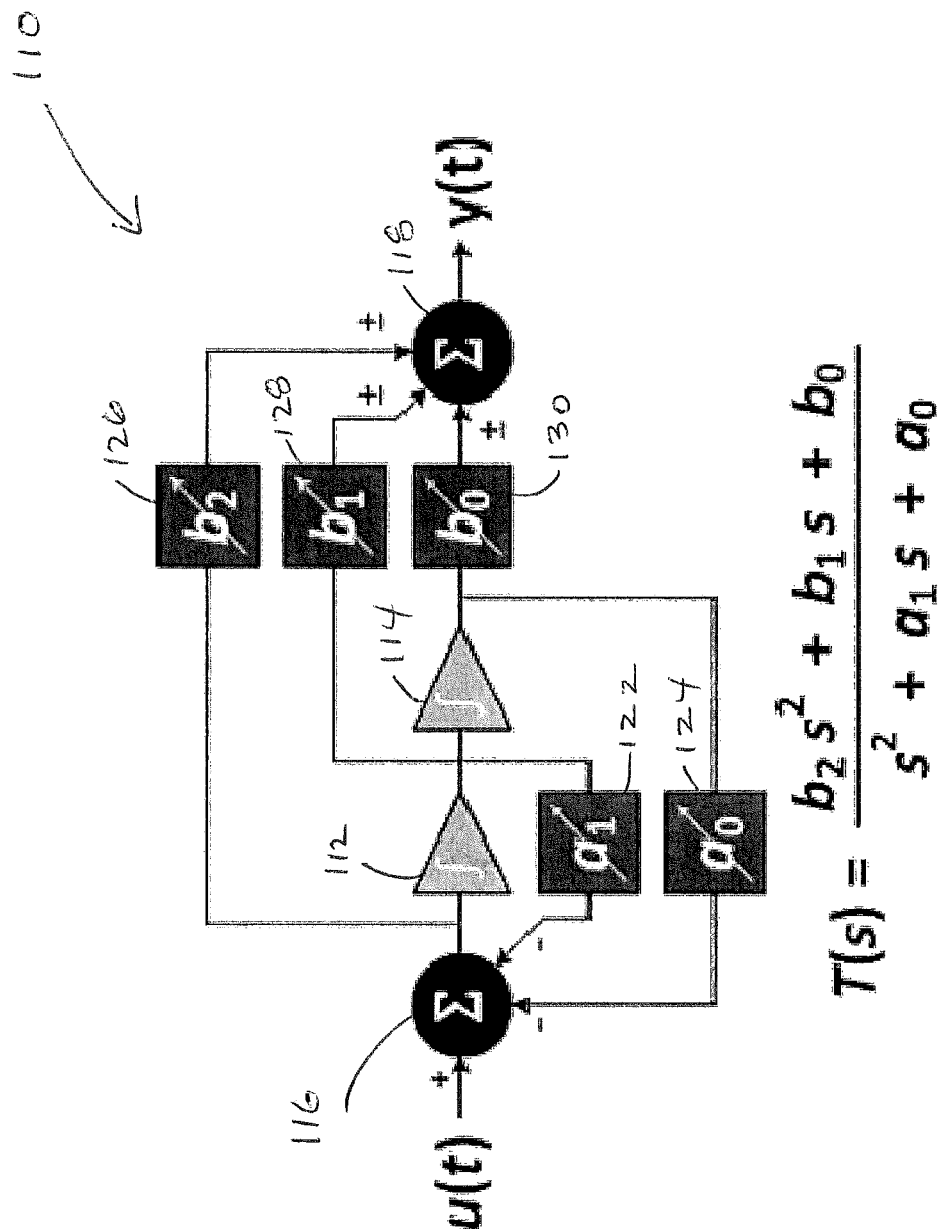
FIGS. 1C, 1D, and 1E are block diagrams of alternative second order canonical forms of a state variable system

FIG. 1C shows a second-order state variable structure 110 that comprises two integration/gain stages, with variable gain attenuators operating within each stage. A combined signal based on a wideband input u(t) is fed to the first integration/gain stage, which, in turn, provides an input to the second integration/gain stage. Variable gain attenuators feed signals forward (b's) 126, 128, 130 and backward (a's) 122, 124 from the input and output of each of the two integrators 112, 114. These signals terminate in a first summing block 116 that combines feedback signals and second summing block 118 that combines feed-forward signals. Example second-order state variable filters may also include fractional gain blocks and additional summers. Varying gains of the variable gain blocks changes a center frequency of the embodiment second-order state variable filters. The transfer function coefficients of a wideband signal processing filter constructed from the structure of FIG. 1C are determined by the variable attenuator values.

Figure 1D:
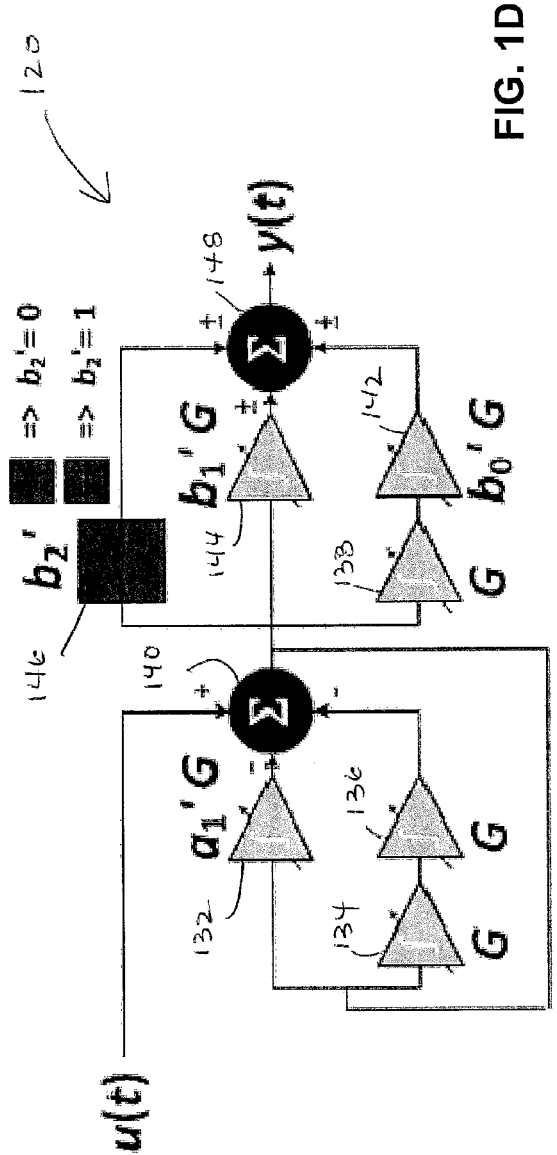

FIG. 1D shows a second-order state variable structure 120 that comprise two integration/gain stages, each of which includes three variable gain integrators 132, 134, 136, 138, 142, 144, two of which are operably coupled to a summing block 140, 148. A combined signal based on a wideband input u(t) is fed to the first integration/gain stage, which, in turn, provides an input to the second integration/gain stage. Each gain stage consists of an upper and lower path, with two variable integrators in the lower path and one in the upper path. A switch 146 operably couples a third, binary-valued signal to the second stage summing block 148. Example second-order state variable filters may also include fractional gain blocks and additional summers. Varying gains of the variable gain blocks changes a center frequency of the embodiment second-order state variable filters. The transfer function coefficients of a wideband signal processing filter constructed from the structure of FIG. 1D are determined by the integrator gain values.

Figure 1E:
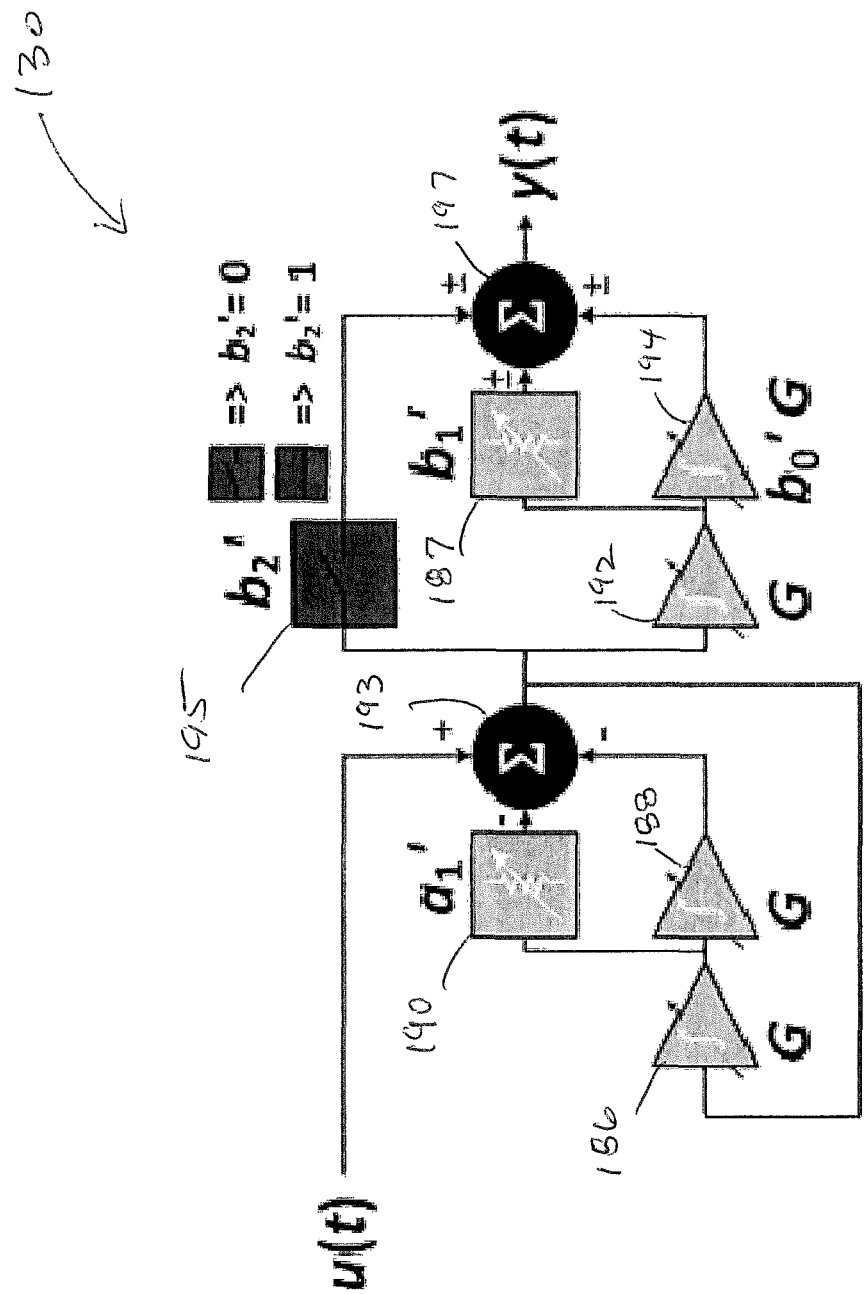

FIG. 1E shows a second-order state variable structure 130 that comprise two integration/gain stages, each of which includes one tunable loss pad 187, 190 and two integrators 186, 188, 192, 194, one of which is operably coupled to a summing block 193, 197. A combined signal based on a wideband input u(t) is fed to the first integration/gain stage, which, in turn, provides an input to the second integration/gain stage. Each gain stage consists of an upper and lower path, with two integrators in the lower path and one tunable loss pad in the upper path. A switch 195 operably couples a third, binary-valued signal to the second stage summing block 197. Example second-order state variable filters may also include fractional gain blocks and additional summers. Varying gains of the variable gain blocks changes a center frequency of the embodiment second-order state variable filters. The transfer function coefficients of a wideband signal processing filter constructed from the structure of FIG. 1E are determined by the tunable loss pads and integrator gain values.

The first- and second-order state variable filters shown in FIGS. 1A to 1E can be generalized to any order by incorporating or removing additional integrators and gain blocks as appropriate. In addition, components in the structures, including the integrators and attenuators (fractional gain blocks) of the second-order structures, can be implemented in 130 nm CMOS. For more on first- and second-order state variable structures, see WO/2009/114123 to Divi Gupta and Dev V. Gupta, which is incorporated herein by reference in its entirety.

When designing a filter, the goal is to implement an impulse response y(t) or equivalently a transfer function that approximates Y(s), the Laplace transform of y(t):

$$Y(s) \approx T_{mn}(s) = \frac{B_m s^m + B_{m-1} s^{m-1} + \ldots + B_0}{s^n + A_{n-1} s^{n-1} + \ldots + A_0} (m \leq n)$$

Equation 1: Transfer function of state variable system

The approximation in Equation 1 can be made to an arbitrary degree of accuracy by adding additional terms in both numerator and denominator polynomials. It can be implemented in the second-order filter state variable structure 150 by using the fractional gain blocks to represent the coefficients in the numerator and denominator (i.e., $a_0$, $a_1$, $a_2$, $b_0$, $b_1$, and $b_2$) of the transfer function. Like variable gain blocks, the fractional gain blocks attenuate or amplify signals according to a corresponding coefficient. Typically, the variable and fractional gain blocks scale signals to a value within a normalized range of −1 to 1, inclusive.

The Summation Form

Equation 1 can be transformed to two forms, namely, the summation form and the product form. To arrive at the summation form, a partial fraction expansion of Equation 1 is followed by an inverse Laplace transform to provide a temporal function, given below in Equation 2, which is a linear combination of complex sinusoids. In this equation, pi and Ri are the ith pole and its corresponding residue, respectively:

$$T_{mn}(s) = \sum_{i=1}^{n} \frac{R_i}{s - p_i} \leftrightarrow y_{mn}(t) = \sum_{i=1}^{n} R_i e^{p_i t}$$

Equation 2: Temporal transfer function

The real pole/residue pairs in Equation 2 can be realized using the first-order canonical form structure in FIG. 1A. The complex pole/residue pairs occur as complex conjugates and are combined as in Equation 3 where all coefficients (a's and b's) are real.

$$T_i(s) = \frac{R_i}{s - p_i} + \frac{R_i^*}{s - p_i^*}$$
$$= \frac{2Re[R_i]s - 2Re[p_i R_i^*]}{s^2 - 2Re[p_i]s + [p_i]^2}$$
$$= \frac{b_1 s + b_0}{s^2 + a_1 s + a_0}$$

Equation 3: Transfer function with complex pole/residue pairs

These conjugate pairs can be realized using the second-order observer canonical form structure in FIG. 1B or alternatively FIG. 1C, 1D, or 1E. The first-order structure is essentially a special case of the second-order structure with $b_0 = a_0 = 0$. Such second-order structures can then be combined and their outputs cascaded to realize $T_{mn}(s)$.

Figure 2:
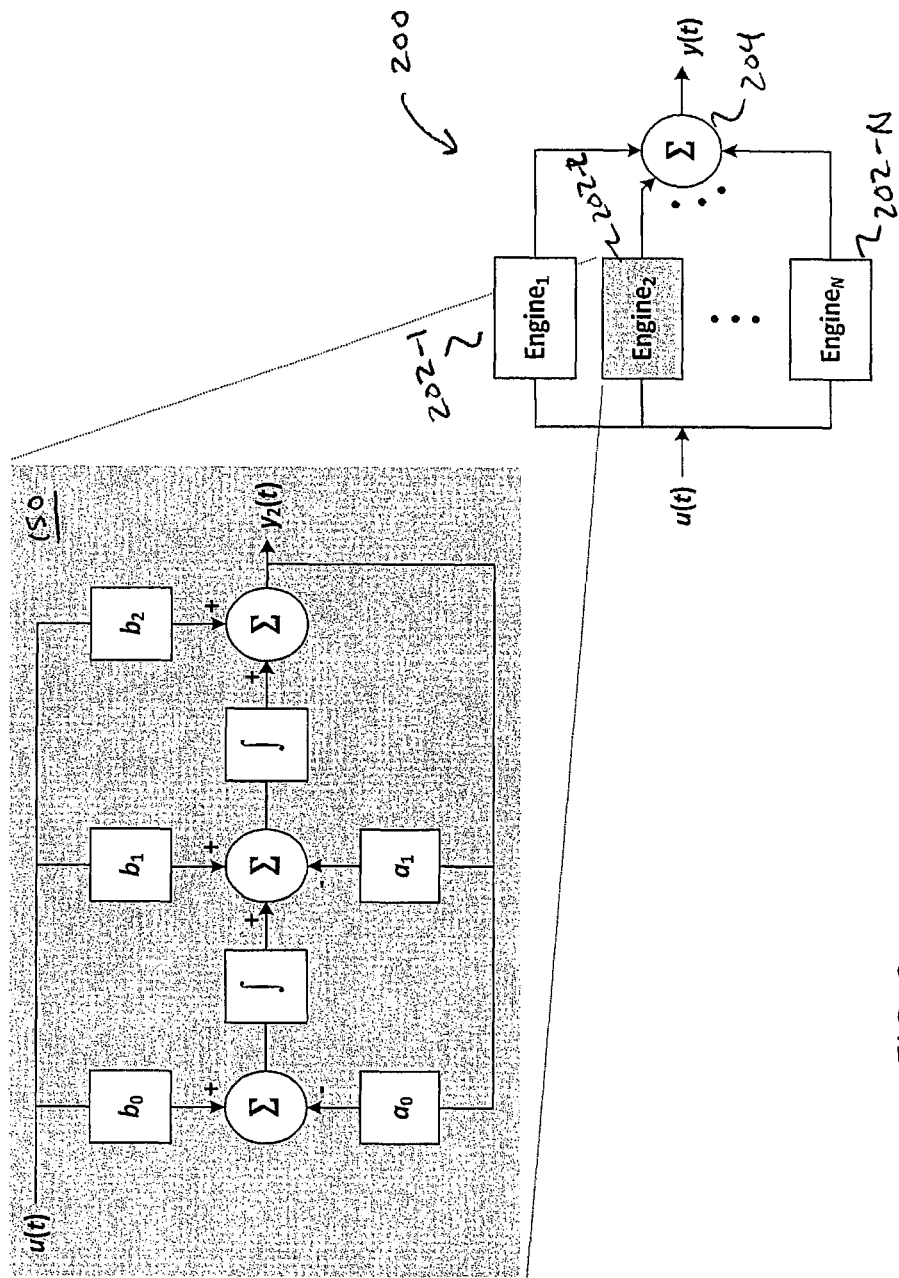
FIG. 2 is a block diagram of a $2N^{th}$ order wideband SISO FPAA based on the summation form of the state variable system transfer function using the block diagram of FIG. 1B (alternatively FIG. 1C, 1D, or 1E).

FIG. 2 shows a wideband FPAA 200 that implements the transfer function $T_{mn}(s)$ of Equation 3. The FPAA 200 includes a plurality of engines 202, each of which includes a second-order state variable structure 150 (FIG. 1). The engines 202 operate in parallel on a wideband input u(t), and a summer 204 combines the outputs of the engines 202 to produce a processed analog output y(t).

An integrator followed by a gain stage G has frequency scaling effects. The gain stage G transforms the transfer function $T_{mn}(s)$ to $T(s/G)$. Therefore, if $T_{mn}(s)$ is implemented as a bandpass filter, the center frequency of the filter can be swept across the band merely by changing the gain. This technique is applicable both in the summation form and in the product form.

The Product Form

To arrive at the product form, Equation 1 can be rewritten as in Equation 4.

$$T_{mn}(s) = B_m \frac{\prod_{i=1}^{m}(s - z_i)}{\prod_{j=1}^{n}(s - p_j)} = \prod_{j=1}^{n} \frac{b_{2j} s^2 + b_{1j} s + b_{0j}}{s^2 + a_{1j} s + a_{0j}}$$

Equation 4: Transfer function in product form

The second equality in Equation 4 is obtained by grouping conjugate zero pairs with proper pole pairs. Any real zero can be grouped with a real pole, two real poles, or a conjugate pole pair. The last equation indicates the transfer function is a product of many second-order structures as described earlier.

Figure 3:
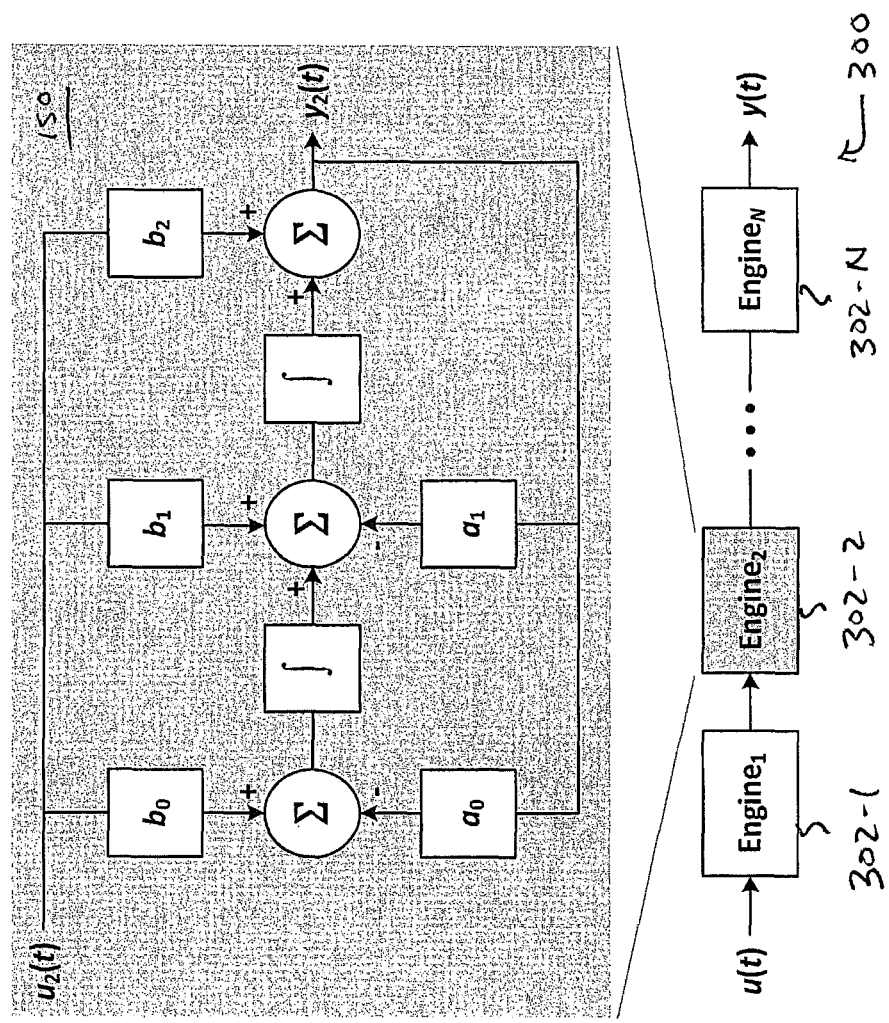
FIG. 3 is a block diagram of a $2N^{th}$ order wideband SISO FPAA based on the product form of the state variable system transfer function using the block diagram of FIG. 1B (alternatively FIG. 1C, 1D, or 1E).

FIG. 3 shows a SISO FPAA 300 that includes a plurality of engines 302 cascaded to realize $T_{mn}(s)$. Each engine 302 includes a second-order structure 150 as shown in FIG. 1B or alternatively FIG. 1C, 1D, or 1E. As described above, blocks a and b are attenuators whose values characterize the transfer function of the FPAA.

Figure 4:
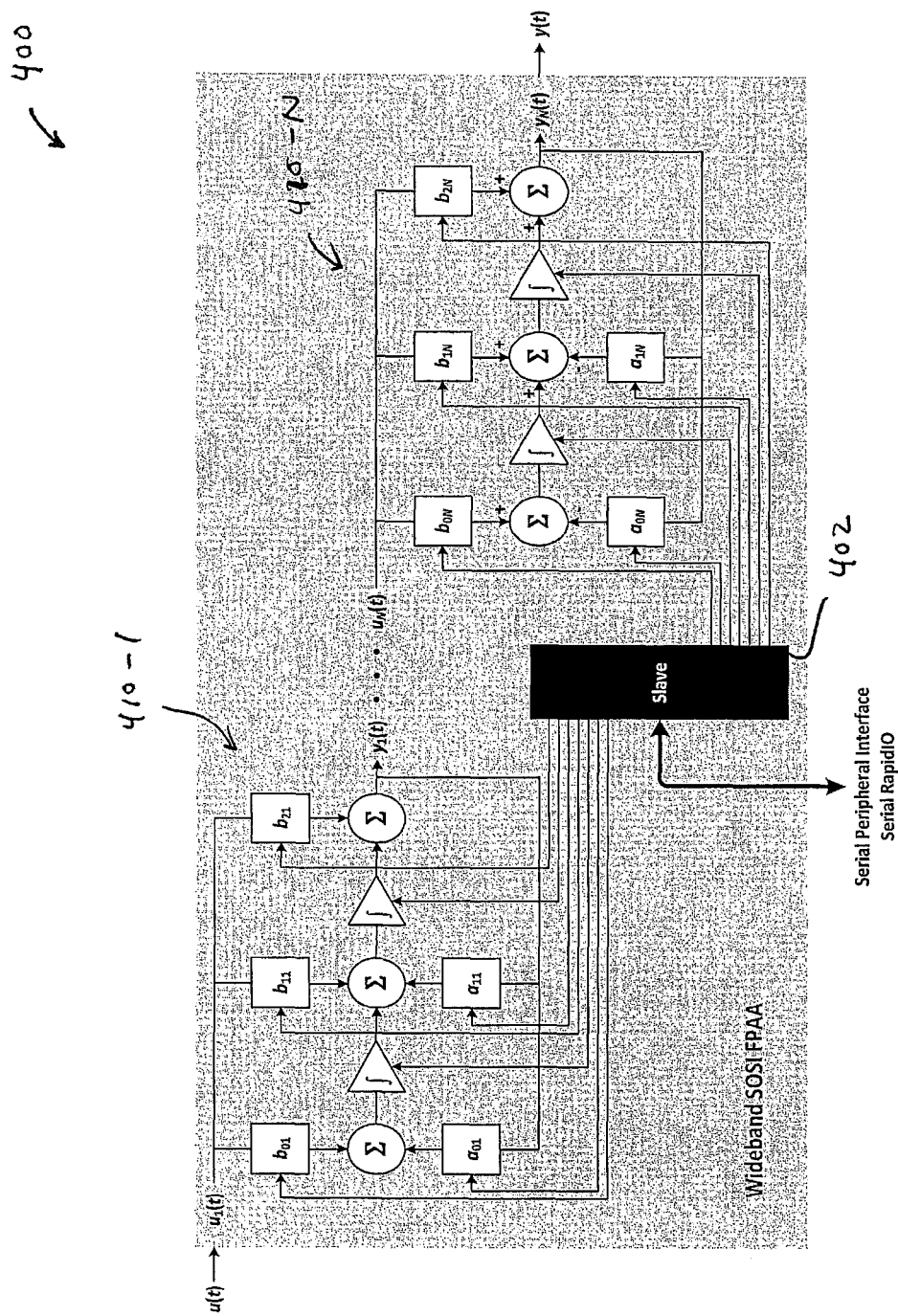
FIG. 4 is a block diagram of a $2N^{th}$ order wideband SISO FPAA with serial peripheral interface (SPI) or Serial RapidIO control using the block diagram of FIG. 1B (alternatively FIG. 1C, 1D, or 1E).

FIG. 4 shows a top level digital wiring diagram of a SISO FPAA 400 that includes a plurality of cascaded second-order structures 410 based on FIG. 1B, alternatively FIG. 1C, 1D, or 1E, that operate in series on a wideband analog input u(t) to produce a processed analog output y(t). (For simplicity, FIG. 4 shows only the first and $N^{th}$ structures 410-1 and 410-N.) The integrators and attenuators (fractional gain blocks) of the second-order structures can be implemented in 130 nm CMOS. A Serial Peripheral Interface (SPI) or Serial RapidIO 402 coupled to each second-order structure 410 controls the FPAA 400 by changing the attenuator values and the integrator gains of the second-order structures 410. The signal processing is performed in the analog domain and the digital signals are only used to change the transfer function.

Figure 5:
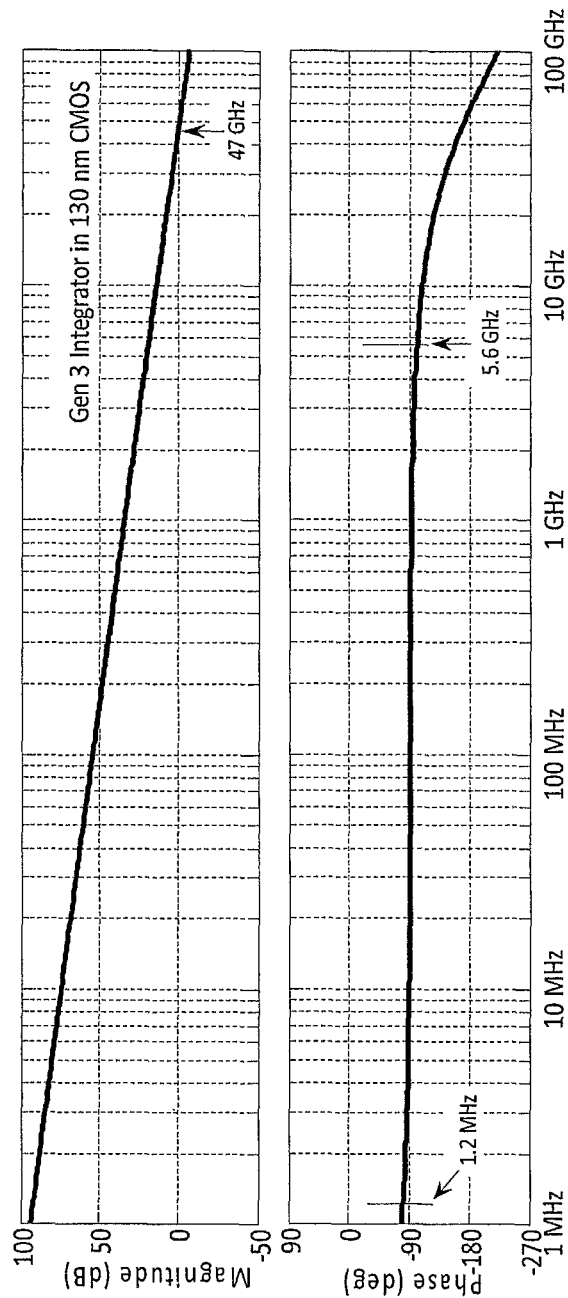
FIG. 5 shows plots of pre-layout magnitude (top) and phase (bottom) of an integrator designed in 130 nm CMOS.

FIG. 5 shows the performance of the integrator. The integrator magnitude has a 20 dB per decade slope (in log-log scale) and its phase is −90°±10° from 1.2 MHz to 5.6 GHz, corresponding to a transfer function of 1/s. It has a unity gain frequency of 47 GHz.

Figure 6:
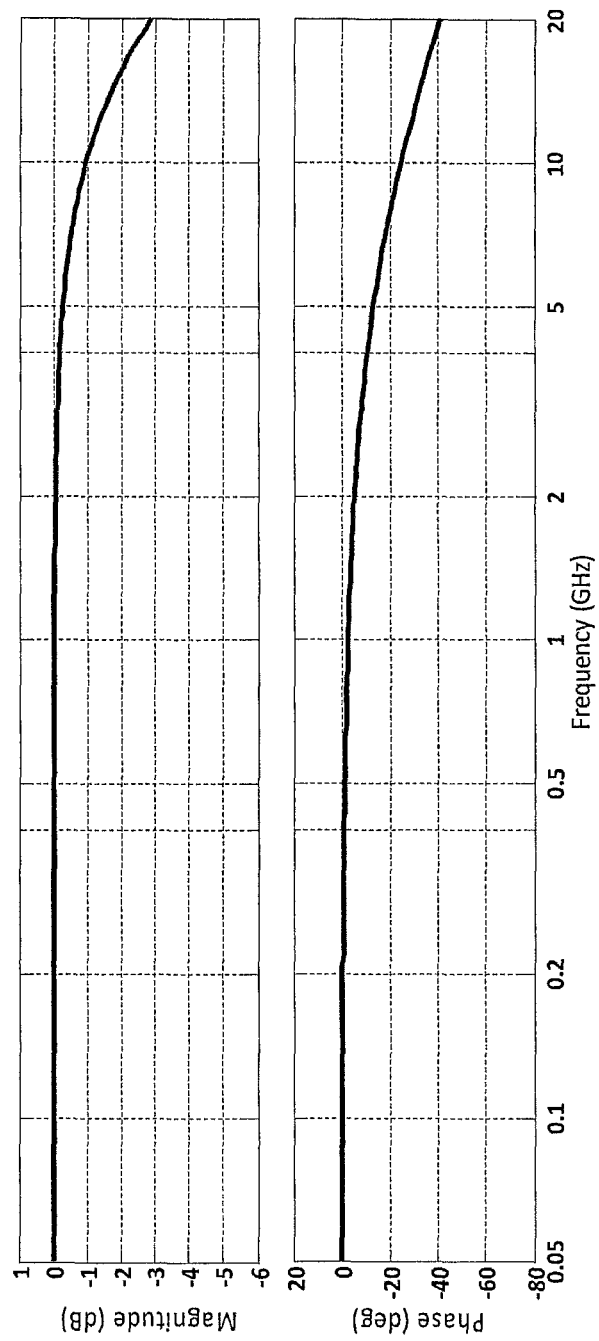
FIG. 6 shows plots of pre-layout magnitude (top) and phase (bottom) of an attenuator designed in 130 nm CMOS.

FIG. 6 shows the performance of the attenuator. The frequency is 3.8 GHz at −10° phase.

Analytical Framework for a Generalized SISO and MIMO System

The goal in this section is to develop a generalized framework for a wideband adaptive FPAA in state variable structure.

$\dot{\underline{x}} = A\underline{x} + B\underline{u}$ Where $\underline{x}$ represents the state of the FPAA system and it has size of K $\underline{y} = C\underline{x} + D\underline{u}$ x 1, where K defines the order of the FPAA $\underline{u}$ is the input vector of size M×1

$\underline{y}$ is the output vector of size N×1

$$\dot{x} = \frac{dx}{dt}$$

is a vector size K×1

Figure 7A:
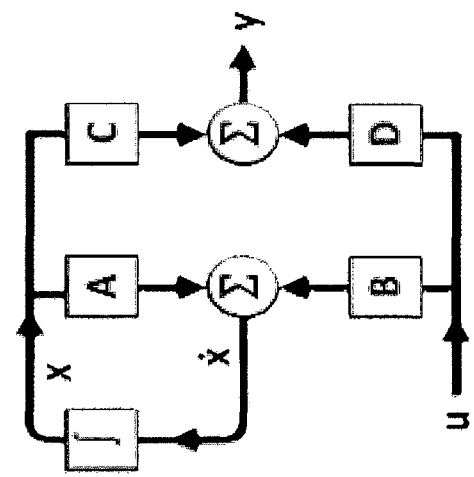
FIG. 7A illustrates state space equations of the generalized FPAA with M inputs and N outputs.
Figure 7A:
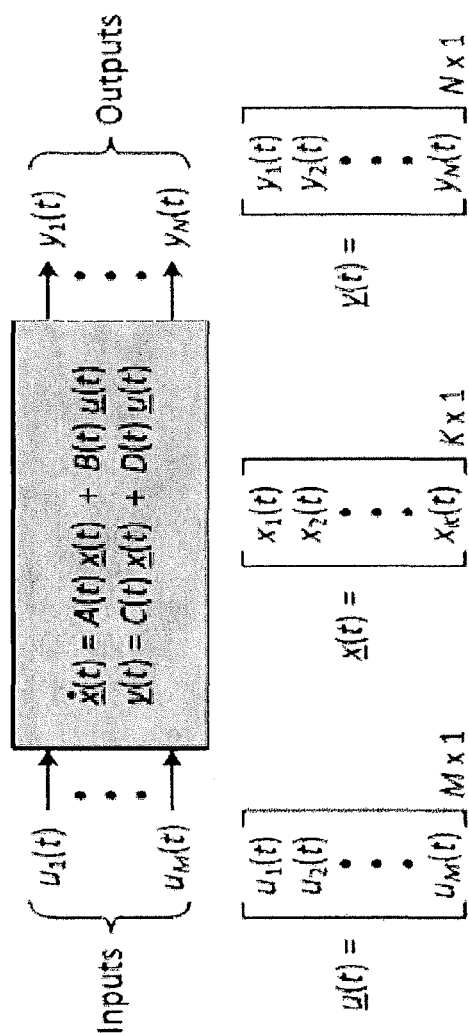

A, B, C and D are matrices determining the state of the FPAA system of size (K×K), (K×M), (N×K) and (N×M) respectively FIG. 7A illustrates state space equations of the generalized FPAA with M inputs and N outputs.

Figure 7B:
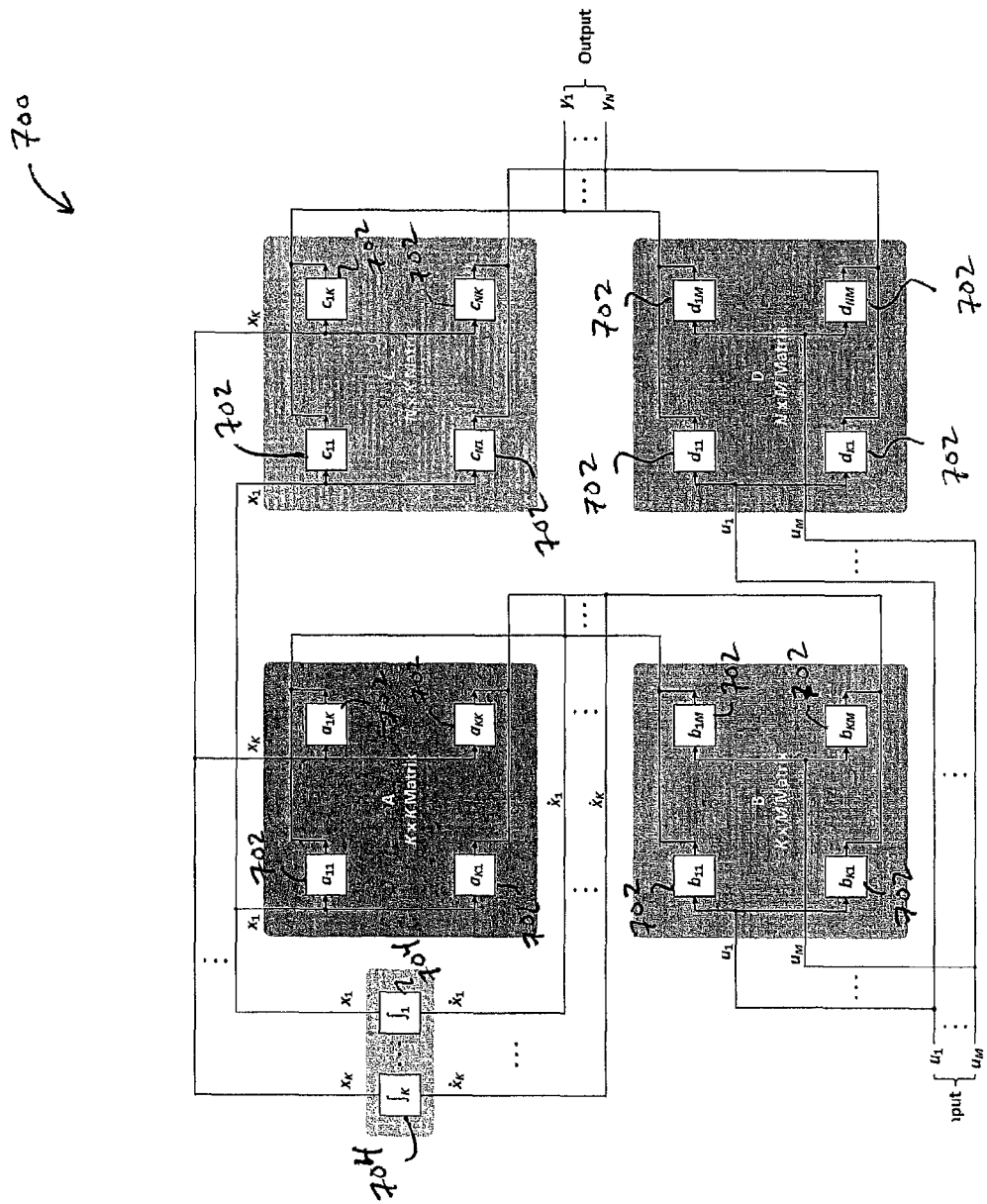
FIG. 7B is a generalized block diagram of wideband FPAA with M inputs and N outputs.

FIG. 7B is the implementation block diagram of a wideband FPAA 700 using the equations above. The elements in matrices A, B, C and D are attenuators 702 and the integrator vector includes integrator/gain blocks 704. The FPAA 700 has K integrator/gain blocks 704 and (K+N)(K+M) attenuators 702. The performance of example integrators 704 and attenuators 702 can be found in FIGS. 5 and 6, respectively, for implementation in 130 nm CMOS. The transfer function and frequency scaling is controlled and changed similar to the SISO FPAA 400 in FIG. 4. The generalized block diagram is a wideband SISO FPAA 700 of $K^{th}$ order when M=1 and N=1. It is a MIMO FPAA 700 of $K^{th}$ order when M>1 and N>1.

Several features of this architecture are especially significant. First, the integrators 704 are locally tuned, which allows for individual tuning. This can be useful when multiple, differing inputs are present, each dedicated to a distinct integrator 704. Second, the attenuators 702 use randomization algorithms to create a finer range of values, making them extremely precise. This is important in many MIMO radar systems, where individual antenna elements see slightly delayed versions of an input signal. Capturing this fine delay and varying the circuit response appropriately is often critical to the application. Finally, the connections between summation points are nearest neighbor, minimizing routing parasitic and improving bandwidth through the switch matrix. As in the SISO case, this architecture allows for a programmable and dynamic implementation of any specified MIMO filter and transfer function.

Combination FPGA/FPAA Architectures for Wideband Modems

The wideband FPAAs described above have a broad range of applications in commercial and defense markets. This can be explained by considering a radar application of Xilinx's Virtex-7 855T listed in the Xilinx FPGA technology roadmap. The Xilinx radar application makes use of twenty-four 8- to 16-bit ADCs to supply digital inputs to the FPGA. Each ADC is followed by a digital downconversion (DDC) to create baseband in-phase (I) and quadrature (Q) channels. This type of high-end radar application can have an input frequency of 3 GHz or more, with multi-Gbps data being acquired and processed. However, the ADC power consumption in this example is astronomical, as it requires 2.4 W minimum at 3 Gbps.

Figure 8:
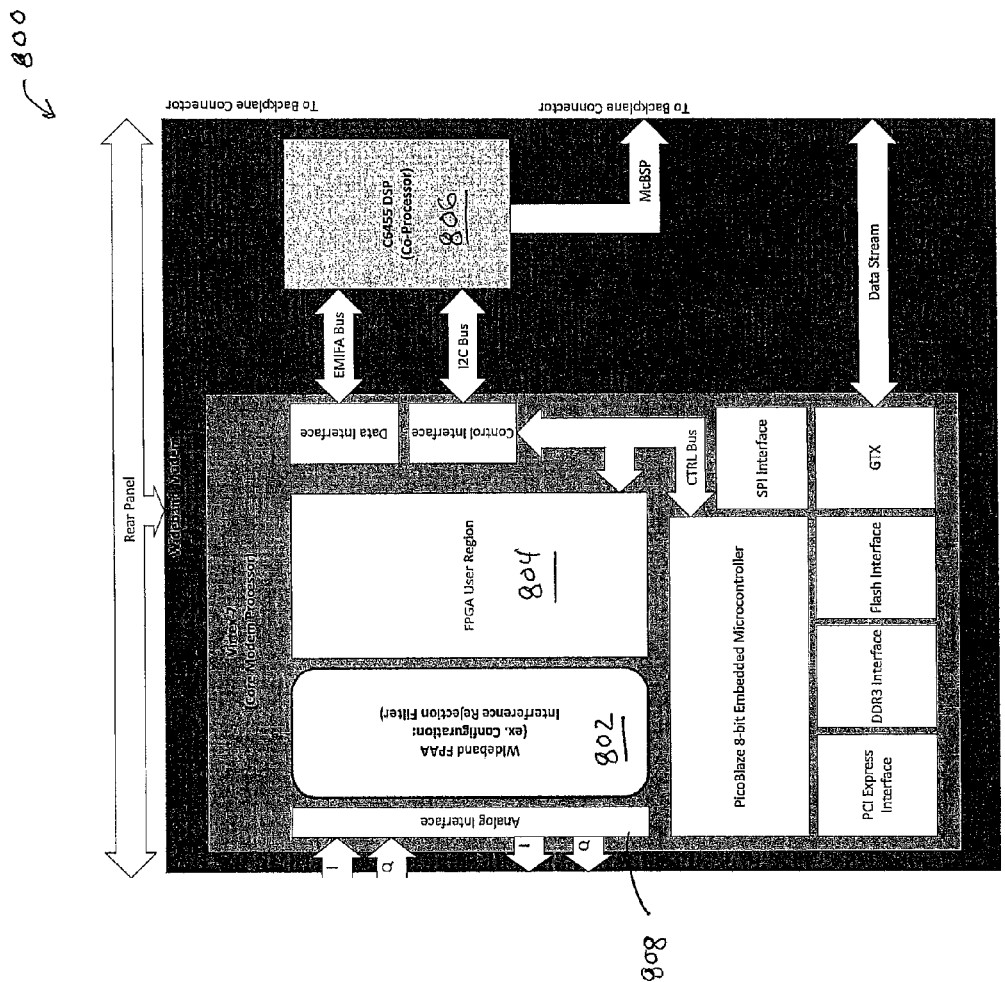
FIG. 8 is a block diagram of a modem solution using a wideband FPAA within a Xilinx Virtex-7 FPGA with a Texas Instruments C6455 digital co-processor.

FIG. 8 shows a hybrid modem architecture 800 that uses an FPGA 804 with wideband FPAA technology for baseband processing of radar signals. Analog I/Q data is fed directly to an analog interface 808 coupled to a wideband FPAA 802, replacing the ADC and internal DDC stage. The FPAA 802, which is based on state variable technology, perform wideband signal processing chores in continuous time, reducing the signal processing load on an FPGA 804. Signals from each antenna element in the radar antenna are independently processed through the individual baseband channel level, and digital beamforming is done at baseband. In one example of the hybrid modem architecture 800 shown in FIG. 8, the wideband FPAA 802 is integrated into the Xilinx Virtex-7 FPGA 804, with a TI C6455 digital signal processor 806 acting as a co-processor. Broadband processing is done by the wideband FPAA while the narrowband processing is performed elsewhere in the FPGA and in the DSP.

The hybrid FPAA/FPGA modem architecture 800 is a much smaller and cheaper design than other architectures and realizes tremendous power savings by eliminating the ADCs and DDC stage. Moreover, the FPAA 802 enables designers to implement programmable filters of arbitrary order. Wideband analog signal processing performed by FPAA filters makes tasks such as interference rejection significantly more robust, as they are performed over greater bandwidth than currently achievable. This approach is facilitated by an eventual integration of the wideband FPAA into FPGAs made by companies such as Xilinx and Altera.

Wideband FPAAs can be implemented in deep submicron CMOS, e.g., 130 nm, 65 nm, 45 nm, and 22 nm CMOS nodes. Each node offers the advantage of high cut-off frequency, but developing analog circuits in these nodes is challenging owing to non-systemic mismatch problems.

While this invention has been particularly shown and described with references to example embodiments thereof, it will be understood by those skilled in the art that various changes in form and details may be made therein without departing from the scope of the invention encompassed by the appended claims.

What is claimed is:

1. A field programmable analog array (FPAA) comprising:
   state variable filter engines arranged in parallel, each state variable filter engine comprising at least one variable attenuator and at least one variable integrator configured to operate on a wideband analog signal; and
   a summer configured to add outputs from the state variable filter engines.

2. The FPAA of claim 1 wherein the state variable filter engines comprise second-order state variable filters.

3. The FPAA of claim 1 wherein the state variable filter engines are implemented in at least one of 130 nm CMOS, 65 nm CMOS, 45 nm CMOS, and 22 nm CMOS.

4. The FPAA of claim 1 further including a digital controller configured to adjust integration and attenuation values of at least one of the state variable filter engines.

5. The FPAA of claim 1 in combination with a field programmable gate array.

6. A field programmable analog array (FPAA) comprising:
   state variable filter engines arranged in series, each state variable filter engine comprising at least one variable attenuator and at least one variable integrator configured to operate on a wideband analog signal.

7. The FPAA of claim 6 wherein the state variable filter engines comprise second-order state variable filters.

8. The FPAA of claim 6 wherein the state variable filter engines are implemented in at least one of 130 nm CMOS, 65 nm CMOS, 45 nm CMOS, and 22 nm CMOS.

9. The FPAA of claim 6 further including a digital controller configured to adjust integration and attenuation values of at least one of the state variable filter engines.

10. The FPAA of claim 6 in combination with a field programmable gate array.

11. A field programmable analog array (FPAA) comprising:
    N×M attenuator matrices configured to operate on at least one wideband analog signal, each attenuator matrix including a plurality of variable attenuators, where K, M, and N, are positive integers; and
    K variable integrators, each integrator operably coupled to each of the attenuator matrices and configured to integrate signals from at least one of the attenuator matrices.

12. The FPAA of claim 11 wherein M=1 and N=1 and the FPAA is a single-input single-output FPAA.

13. The FPAA of claim 11 wherein M>1 and N>1 and the FPAA is a multiple-input multiple-output FPAA.

14. The FPAA of claim 11 wherein the variable integrators are locally tuned.

15. The FPAA of claim 11 wherein the variable attenuators use randomization algorithms to create a finer range of values.

16. The FPAA of claim 11 wherein the state variable filter engines are implemented in at least one of 130 nm CMOS, 65 nm CMOS, 45 nm CMOS, and 22 nm CMOS.

17. The FPAA of claim 11 further including a digital controller configured to adjust integration and attenuation values of at least one of the state variable filter engines.

18. The FPAA of claim 11 in combination with a field programmable gate array.

* * * * *